( 12 ) United States Patent
Blaum et al.

(10) Patent No.: US 7,064,687 B1
(45) Date of Patent: Jun. 20, 2006

(54) TECHNIQUES FOR MODULATING DATA USING SHORT BLOCK ENCODERS

(75) Inventors: Mario Blaum, San Jose, CA (US); Roy D. Cideciyan, Ruschlikon (CH); Evangelos S. Eleftheriou, Zurich (CH); Richard Leo Galbraith, Rochester, MN (US); Ksenija Lakovic, San Jose, CA (US); Thomas Mittelholzer, Zurich (CH); Travis Oenning, Rochester, MN (US); Bruce A. Wilson, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 11/048,273

(22) Filed: Jan. 31, 2005

(51) Int. Cl.
*H03M 7/00* (2006.01)

(52) U.S. Cl. .................. 341/80; 341/58; 369/59.23; 360/40

(58) Field of Classification Search ............... 341/58, 341/59, 80; 360/40; 369/59.23
See application file for complete search history.

(56) References Cited

U.S. PATENT DOCUMENTS

| 4,707,681 | A | 11/1987 | Eggenberger et al. |
| 4,818,969 | A | 4/1989 | Krakauer et al. |
| 5,241,309 | A | 8/1993 | Cideciyan et al. |
| 5,311,521 | A | 5/1994 | Fitingof et al. |
| 5,757,294 | A | 5/1998 | Fisher et al. |
| 5,757,822 | A | 5/1998 | Fisher et al. |
| 5,760,718 | A | 6/1998 | Schouhamer Immink |
| 6,018,304 | A | 1/2000 | Bessios |
| 6,236,340 | B1 | 5/2001 | Patapoutian et al. |
| 6,417,788 | B1 | 7/2002 | McEwen et al. |
| 6,480,125 | B1* | 11/2002 | Rub et al. ............. 341/50 |
| 6,557,124 | B1 | 4/2003 | Cideciyan et al. |
| 6,651,210 | B1* | 11/2003 | Trott et al. .............. 714/758 |
| 2006/0007024 | A1* | 1/2006 | Tsang et al. .............. 341/50 |

OTHER PUBLICATIONS

J.D. Coker et al., "Implementation of PRML in a rigid disk drive", IEEE Transactions on Magnetics, vol. 27, No. 6, Nov. 1991.
Roy D. Cideciyan et al., "A PRML system for digital magnetic recording", IEEE Journal on Selected Areas in Communication, vol. 10, No. 1, Jan. 1992.
E. Eleftheriou et al., "Noise-predictive maximum-likelihood (NPML) detection for the magnetic recording channel", IEEE 1996, no month.

(Continued)

*Primary Examiner*—Howard L. Williams
(74) *Attorney, Agent, or Firm*—Townsend and Townsend and Crew LLP (57) ABSTRACT

Techniques are provided for applying modulation constraints to data streams using a short block encoder. A short block encoder encodes a subset of the bits in a data stream. Then, the even and odd interleaves in a data stream are separated into two data paths. A first modulation encoder encodes the even interleave according to a first modulation constraint. A second modulation encoder encodes the odd interleave according to a second modulation constraint, which in general coincides with the modulation constraint for even interleave.

22 Claims, 2 Drawing Sheets

OTHER PUBLICATIONS

Jonathan D. Coker et al., "Noise-Predictive Maximum Likelihood (NPML) Detection", IEEE Transactions on Magnetics, vol. 34, No. 1, Jan. 1998.

Jaekyun Moon et al., "Maximum Transition Run Codes for Data Storage Systems", IEEE Transactions on Magnetics, vol. 32, No. 5, Sep. 1996.

Roy D. Cideciyan et al., "Maximum Transition Run Codes for Generalized Partial Response Channels", IEEE Journal on Selected Areas in Communications, vol. 19, No. 4, Apr. 2001.

Kees A. Schouhamer Immink et al., "Codes for Digital Recorders", IEEE Transactions on Information Theory, vol. 44, No. 6, Oct. 1998.

"Circuitry for Performing Error Correction Calculations on Baseband Encoded Data to Eliminate Error Propagation", IBM Technical Disclosure Bulletin, Mar. 1981, author unknown.

M. Mansuripur, "Enumerative Modulation Coding with Arbitrary Constraints and Post-Modulation Error Correction Coding for Data Storage Systems", SPIE vol. 1499 Optical Data Storage, 1991, no month.

Adriaan J. van Wijngaarden et al., "Efficient Error Control Schemes for Modulation and Synchronization Codes", IEEE Aug. 1998.

Adriaan J. van Wijngaarden et al., "Maximum Runlength-Limited Codes with Error Control Capabilities", IEEE Journal on Selected Areas in Communications, vol. 19, No. 4, Apr. 2001.

William H. Kautz, "Fibonacci Codes for Synchronization Control", IEEE Transactions on Information Theory, Apr. 1965.

Kees A. Schouhamer Immink, "A Practical Method for Approaching the Channel Capacity of Constrained Channels", IEEE Transactions on Information Theory, vol. 43, No. 5, Sep. 1997.

Thomas M. Cover, "Enumerative Source Encoding", IEEE Transactions on Information Theory, vol. IT-19, No. 1, Jan. 1973.

Jorge Campello de Souza et al., "Constrained Systems with Unconstrained Positions", IEEE Transactions on Information Theory, vol. 48, No. 4, Apr. 2002.

D.T. Tang et al., "Block Codes for a Class of Constrained Noiseless Channels", Information and Control 17, 1970, no month.

* cited by examiner

TECHNIQUES FOR MODULATING DATA USING SHORT BLOCK ENCODERS

BACKGROUND OF THE INVENTION

The present invention relates to techniques for imposing modulation constraints on data using short block encoders, and more particularly, to techniques for imposing modulation constraints on a subset of bits in each data block using a short block encoder prior to imposing modulation constraints on the even and odd interleaves.

A disk drive can write data bits onto a data storage disk such as a magnetic hard disk. The disk drive can also read data bits that have been stored on a data disk. Certain sequences of data bits are difficult to write onto a disk and often cause errors during read-back of the data.

Binary sequences are routinely transformed from one representation to another using precoders and inverse precoders, according to well known techniques. In describing this invention all binary sequences are represented as PR4 sequences that can be transformed into an NRZI representation by a precoder that convolves with 1/1+D or into an NRZ representation by a precoder which convolves with $1/(1+D^2)$.

Long sequences of consecutive zeros (e.g., 40 consecutive zeros) are examples of data bit patterns that are prone to errors. A long sequence of zeros in alternating positions (e.g., 0a0b0c0d0 . . . , where a, b, c, d may be 0 or 1) is another example of an error prone data bit pattern.

Therefore, it is desirable to eliminate error prone bit sequences in user input data. Eliminating error prone bit sequences ensures reliable operation of the detector and timing loops in a disk drive system. One way to eliminate error prone bit sequences is to substitute the error prone bit sequences with non-error prone bit patterns that are stored in memory in lookup tables. Lookup tables, however, are undesirable for performing substitutions of very long bit sequences, because they require a large amount of memory.

Many disk drives have a modulation encoder. A modulation encoder uses modulation codes to eliminate sequences of bits that are prone to errors. Fibonacci codes are one example of modulation codes that are used by modulation encoders. Fibonacci codes provide an efficient way to impose modulation code constraints on recorded data to eliminate error prone bit sequences.

A Fibonacci encoder maps an input number to an equivalent number representation in a Fibonacci base. A Fibonacci encoder maps an input vector with K bits to an output vector with N bits. A Fibonacci encoder uses a base with N vectors, which is stored as an N×K binary matrix. Successive application of Euclid's algorithm to the input vector with respect to the stored base gives an encoded vector of length N.

Fibonacci codes are naturally constructed to eliminate long runs of consecutive one digits. This is expressed in the literature as the j constraint, where the parameter j enumerates the longest permitted run of ones. A trivial modification of the Fibonacci code is formed by inverting the encoded sequence. This inverted Fibonacci code eliminates long runs of consecutive zero digits. This constraint is expressed in the literature variously as the k constraint or G constraint, where the parameter k (or G) enumerates the longest permitted run of zeros.

Maximum transition run (MTR) codes are one specific type of modulation codes that are used in conjunction with 1/(1+D) precoders. With respect to MTR codes, a j constraint refers to the maximum number of consecutive ones, a k constraint refers to the maximum number of consecutive zeros, and a t constraint refers to the maximum number of consecutive pairs of the same bits (e.g., aabbccddee . . . ).

Error prone sequences of the form 0a0b0c0d0 as described above are eliminated by the I constraint where the parameter I enumerates the longest run of consecutive zeros in even or odd subsequences. It therefore be desirable to provide modulation encoders extend the Fibonacci codes construction to encompass combined G and I constraints.

BRIEF SUMMARY OF THE INVENTION

The present invention provides techniques for applying modulation constraints to data streams using a short block encoder. A short block encoder applies a modulation constraint to a subset of the bits in each data block. Then, the even and odd interleaves in a data block are separated into two data paths. A first modulation encoder encodes the even bits according to a modulation constraint for even bits. A second modulation encoder encodes the odd bits according to a modulation constraint for odd bits, which in general coincides with the modulation constraint for even bits. The constrained even and odd interleaves are then interleaved to form one serial data stream.

According to an embodiment of the present invention, a short block encoder of the present invention improves the rate of the resulting interleaved code by allowing the even bit and the odd bit modulation encoders to map M-bit input vectors to M-bit output vectors. The overall code transforms (2M–1)-bit vectors into 2M-bit vectors.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
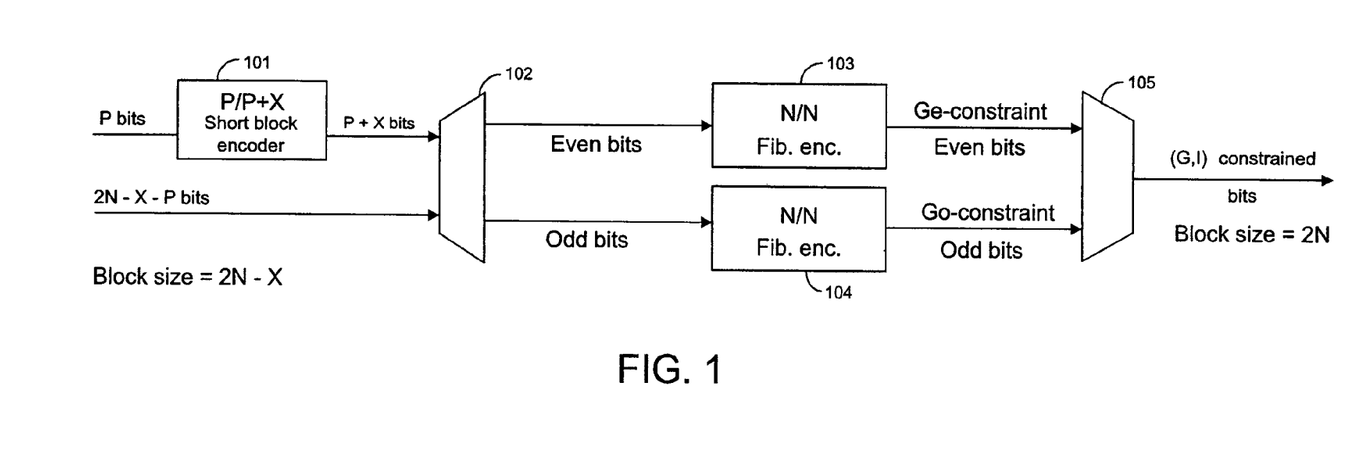
FIG. 1 illustrates a modulation encoding scheme that includes a short block encoder and that applies modulation constraints to even and odd interleaves separately, according to an embodiment of the present invention.

FIG. 1 illustrates a generalized embodiment of a modulation encoding scheme of the present invention. The embodiment of FIG. 1 has a short block encoder that applies modulation constraints to a subset of each data block. A demultiplexer separates the even and odd interleaves in the data block including the bits generated by the short block encoder. Two modulation encoders then apply constraints to the even and odd interleaves separately.

The embodiment of FIG. 1 has two Fibonacci encoders that map N bit input numbers to N bit output numbers. The modulation encoding scheme of FIG. 1 is able to perform N-bit to N-bit mappings on interleaved data by adding a short block encoder 101 to the data before the data is modulation encoded. The short block encoder applies a constraint to the data that reduces the number of possible values of the data. This technique allows the modulation encoders to map a reduced set of N-bit input numbers to N-bit output numbers on an N-bit to N-bit basis, even though the N-bit output numbers are constrained to having less than $2^N$ possible values.

In the embodiment of FIG. 1, a portion P of 2N−X bits are fed into a short block encoder 101. Short block encoder 101 substitutes the first P bits in the block of data with a set of P+X short block bits. Short block encoder 101 can, for example, be a lookup table that maps each possible set of P bits in the user data to a set of P+X short block bits. The P+X short block bits are selected from the table and substituted for the P bits. Short block encoder 101 performs a simple mapping of P bits into P+X bits to enforce a particular set of constraints in order to reduce the number of possible values of each block of the input data.

Demultiplexer 102 receives the P+X output bits of encoder 101 and the remaining 2N−X−P bits of the data block. Demultiplexer 102 divides the resulting 2N data bits into its even and odd interleaves.

Fibonacci encoder 103 converts the N even interleaves into N output bits that are constrained according to a global even bit constraint Ge using a Fibonacci base. Fibonacci encoder 104 converts the N odd interleaves into N output bits that are constrained according to a global odd bit constraint Go using a Fibonacci base. Fibonacci encoders 103 and 104 both convert reduced N bit input numbers into N bit output numbers, thus performing N-bit to N-bit mappings. According to further embodiments of the present invention, encoders 103 and 104 can also be other types modulation encoders other than Fibonacci encoders.

Multiplexer 105 interleaves the constrained even and odd bits to generate the interleaved data output vectors. For each block of 2N−X data bits input into the system of FIG. 1, 2N bits are generated at the output of multiplexer 105. The extra X bits are added by short block encoder 101.

The output vectors of multiplexer 105 have a global constraint of G and an interleaved constraint of I. The global constraint of the output data is determined by G=1+2×min (Ge, Go), if Ge≠Go; and by G=2×Ge, if Ge=Go. The interleaved constraint of the output data is determined by I=max (Ge, Go).

Figure 2:
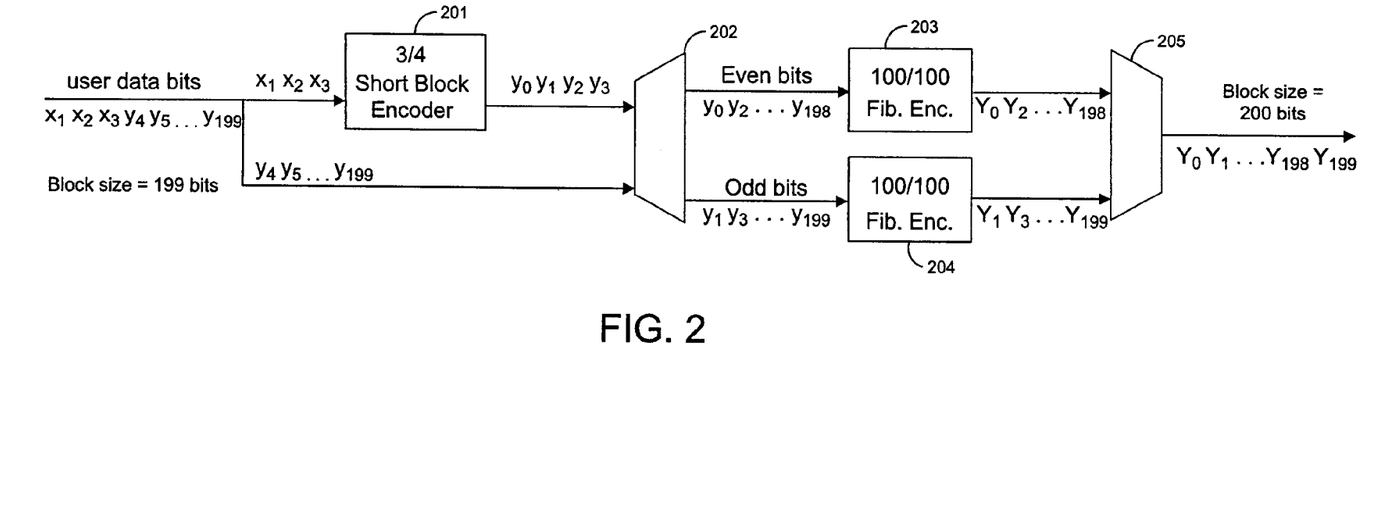
FIG. 2 illustrates an example of a modulation encoding scheme that uses a 3/4 short block encoder, according to an embodiment of the present invention.

FIG. 2 illustrates a specific example of a modulation encoding scheme that includes a 3/4 short block encoder. Short block encoder 201 maps the first 3 bits ($x_1$, $x_2$, $x_3$) of the input data to 4 bits ($y_0$, $y_1$, $y_2$, $y_3$) selected from a lookup table. Short block encoder 201 performs a 3-to-4 mapping to enforce the constraints ($y_0$, $y_2$)≠(1, 1) and ($y_1$, $y_3$)≠(1, 1). Table 1 illustrates mappings that are performed by short block encoder 201 according to this example.

TABLE 1

| Input bits ($x_1$, $x_2$, $x_3$) | Output bits ($y_0$, $y_2$) | Output bits ($y_1$, $y_3$) |
|---|---|---|
| 0 0 0 | 0 0 | 0 0 |
| 0 0 1 | 0 0 | 0 1 |
| 0 1 0 | 0 0 | 1 0 |
| 0 1 1 | 0 1 | 0 0 |
| 1 0 0 | 0 1 | 0 1 |
| 1 0 1 | 0 1 | 1 0 |
| 1 1 0 | 1 0 | 0 0 |
| 1 1 1 | 1 0 | 0 1 |

Thus, short block encoder 201 receives 3-bit input vector ($x_1$, $x_2$, $x_3$) and generates a 4-bit output vector ($y_0$, $y_1$, $y_2$, $y_3$) for each 199-bit data block. Demultiplexer 202 receives the 4-bit output ($y_0$, $y_1$, $y_2$, $y_3$) of short block encoder 201 and the remaining 196-bit vector ($y_4$, $y_5$, ..., $y_{198}$, $y_{199}$). Demultiplexer 202 separates the even and odd interleaves to generate a stream of 100 even bits $y_0$, $y_2$, $y_4$, ..., $y_{198}$ and a stream of 100 odd bits $y_1$, $y_3$, $y_5$, ..., $y_{199}$.

Fibonacci encoder 203 maps the 100-bit even interleaves to a 100-bit Fibonacci code, and Fibonacci encoder 204 maps the 100-bits odd interleaves to a 100-bit Fibonacci code. Multiplexer 205 interleaves the two Fibonacci codes to generate a combined data stream that has 200 bits.

Short block encoder 201 reduces the number of values that can be sent as input to Fibonacci encoders 203 and 204 by (25%). By preventing the first two even bits in the user data from being 11, only three of the four possible values for bits $y_0$ and $y_2$ are allowed (00, 01, and 10). The number of possible integer values for the 100-bit even interleaves is reduced by 25%, because one quarter of the possible 100-bit integer values that begin with 11 are not allowed. As a result, Fibonacci encoder 203 only has to map at the most 75% of the $2^{100}$ possible values for a 100-bit even interleave. Fibonacci encoder 203 can perform 100-bit to 100-bit (N-bit to N-bit) mappings, as long as no more than 25% of the $2^{100}$ possible values are forbidden by the global even bit constraint Ge, i.e., as long as the corresponding Fibonacci code has at least $3 \times 2^{98}$ code sequences.

The same principle holds for the odd interleaves. By preventing the first two odd bits ($y_1$ and $y_3$) in a data block from being 11, only three of the four possible values for bits $y_1$ and $y_3$ are allowed (00, 01, and 10). The number of possible integer values for a 100-bit odd interleave is reduced by 25%, because one quarter of the possible 100-bit integer values that begin with 11 are not allowed. As a result, Fibonacci encoder 204 only has to map at the most 75% of the $2^{100}$ possible values for a 100-bit odd interleave. Fibonacci encoder 204 can perform 100-bit to 100-bit (N-bit to N-bit) mappings, as long as no more than 25% of the $2^{100}$ possible values are forbidden by the global odd constraint Go, i.e., as long as the corresponding Fibonacci code has at least $3 \times 2^{98}$ code sequences.

The short block mapping of 3-to-4 bits allows Fibonacci encoders 203 and 204 to map reduced 100 bit input numbers to 100 bit Fibonacci output numbers (100-bit to 100-bit mappings) for the following reasons. A Fibonacci encoder can map a 199 bit block of data to a 200 bit constrained block of data on a 1-to-1 basis using the Fibonacci encoding technique for rate (N−1)/N. To reduce the size of a 199/200 Fibonacci encoder by half to reduce the storage space requirements, requires that an input number be 99.5 bits and the output number be 100 bits.

A theoretical 99.5 bit block would have $2^{99.5}$ possible values, i.e. $\sqrt{2} \times 2^{99}$ or about $(1.41421) \times 2^{99}$. This means that a 99.5 bit block has about X=$(1.41421) \times 2^{99}$ possible values. A 100 bit block has Y=$2 \times 2^{99}$ possible values. A rate 99.5/100 modulation encoder needs to have at least X code sequences for mapping all of the possible input values to distinct output code sequences.

Therefore, from the possible $2^{100}$ unconstrained 100-bit sequences only about X=$(1.41421) \times 2^{99}$ code sequences are required, which is about 70.7% of the total number of possible 100-bit sequences. The remaining 29.3% of the values of the 100 bit block can be forbidden by a modulation constraint G.

Because short block encoder 201 constrains blocks of the user data bits to having only ¾ of their possible values, Fibonacci encoders 203 and 204 only need to map at the most 75% of the $2^{100}$ possible values of the 100 bit input numbers in the range from 0 to $3 \times 2^{98}-1$. Short block encoder 201 can be replaced with another short block encoder of higher rate, thereby reducing the range of the 100-bit input numbers. In the limiting case, where the rate of the short block encoder is 199/200, the number of required code sequences can be reduced to about X, as long as X/Y is at least $\sqrt{2}/2$ (about 70.7%).

The modulation encoding schemes of FIGS. 1–2 substantially reduce the complexity and storage requirements of an interleaved modulation encoder by replacing a subset of the user bits with a set of constrained bits. A short block encoder of the present invention can replace any desired number of the user bits with constrained bits. Short block encoder 201 is described merely as an example of the present invention and is not intended to limit the scope of the present invention to 3-to-4 bit mappings. One of skill in the art will understand that the present invention includes many different types of short block encoders.

Further embodiments of the present invention will now be described. A short block constrained coding of rate (2K−1)/2K transforms an input bit-sequence $x_1, x_2, \ldots, x_{2K-1}$ into an output bit-sequence $y_0, y_1, \ldots, y_{2K-1}$, where both the even and the odd interleaves of the output sequence satisfy the same constraint, which is defined as follows. Let $z_1 2^{K-1} + z_2 2^{K-2} + \ldots + z_{K-1} 2 + z_K$ be the binary representation of $\lceil 2^{(2K-1)/2} \rceil$, i.e., of the smallest integer larger or equal to the square root of $2^{(2K-1)}$.

The constraint applied by the short block encoder is given by the requirement that the even and odd interleave $y_0, y_2, \ldots, y_{2k-2}$ and $y_1, y_3, \ldots, y_{2K-1}$, respectively, are smaller than the K-bit sequence $z_1, z_2, \ldots, z_K$ with respect to lexicographic ordering with the most significant bit being at the left most position. For instance, a rate—9/10 short block encoder ensures that in each interleave the bit stream will start with a five bit sequence, which is less than 10111. For example, the sequence 11000 is not allowed, but 10110 is a valid 5-bit string. Because both interleaves satisfy the same constraint, the resulting modulation code is balanced with respect to even and odd interleaves.

Figure 3:
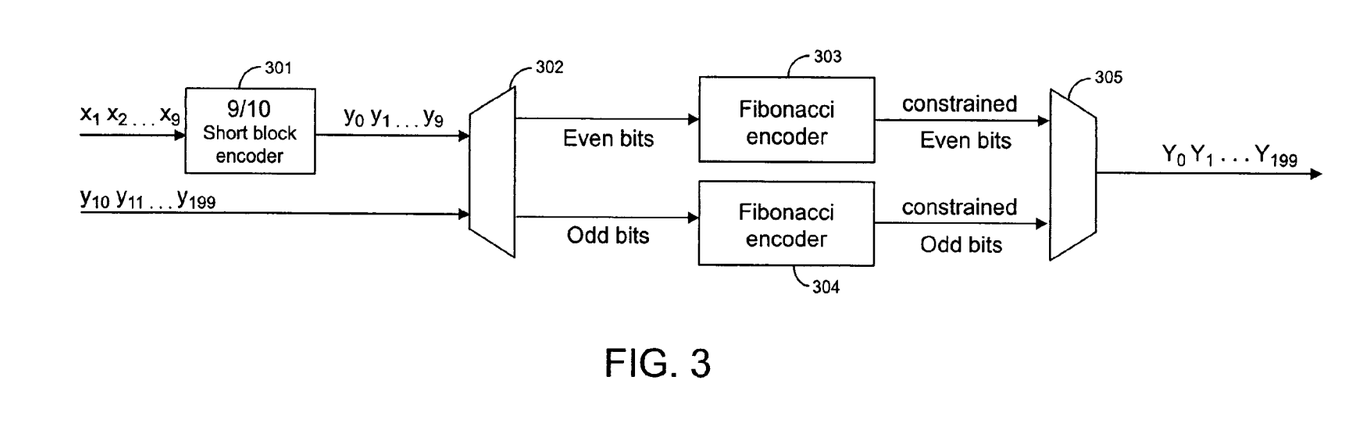
FIG. 3 illustrates an example of a modulation encoding scheme that uses a 9/10 short block encoder, according to an embodiment of the present invention.

An embodiment of a short block encoder having rate—9/10 constrained codes is shown in FIG. 3. The embodiment of FIG. 3 includes a short block encoder 301, a demultiplexer 302, Fibonacci encoders 303–304, and a parallel-to-serial converter (or multiplexer) 305. Short block encoder 301 imposes constraints on the first 9 bits of each data block received. Short block encoder 301 maps the first 9 bits in each data block to 10 output bits to provide a 9/10 rate code.

Demultiplexer 302 separates the even and odd interleaves from the remaining 190-bit vector ($y_{10}, y_{11}, \ldots, y_{199}$) of the original data block and the 10-bit output vector of encoder 301. Fibonacci encoder 303 imposes a modulation constraint on the even interleave to generate a constrained even interleave, and Fibonacci encoder 304 imposes a modulation constraint on the odd interleave to generate a constrained odd interleave, as described above. Parallel-to-serial converter 305 combines the constrained even and constrained odd bits into one serial data stream.

The constraints on the 10-bit output sequence $y_0, y_1, \ldots, y_9$ of the rate—9/10 short block encoder 301 are given by:

$(y_0, y_2) \neq (1,1)$ $(y_0, y_2, y_4, y_6, y_8) \neq (1,0,1,1,1)$ $(y_1, y_3, y_5, y_7, y_9) \neq (1,0,1,1,1)$ These constraints ensure that the largest even/odd output sequence has a 5-bit prefix, that does not exceed 10110. In terms of Boolean equations, these constraints are characterized by:

$y_0 y_2 = 0$ $y_1 y_3 = 0$ $y_0 \sim y_2 y_4 y_6 Y_8 = 0$ $y_1 \sim y_3 y_5 y_7 y_9 = 0$ The symbol ~ stands for negation, multiplication stands for AND, and addition stands for OR. Among these three operations, negation has the highest precedence, and OR has the lowest precedence. An efficient implementation of the rate—9/10 encoder 301 is obtained using the technique of gated partitions. Four partitions $m_1$–$m_4$ are specified by the following Boolean variables, where $x_1$–$x_9$ represent the 9-bit inputs to encoder 301:

$m_1 = \sim x_1$ $m_2 = x_1 x_2 \sim (x_4 x_6 x_8)$ $m_3 = x_1 \sim x_2 \sim (x_5 x_7 x_9)$ $m_4 = \sim (m_1 + m_2 + m_3)$ The input/output map of encoder 301 is specified by:

$y_0 = m_2 + m_4$ $y_1 = m_3 + m_4$ $y_2 = m_1 x_2 + m_3 x_3$ $y_3 = m_1 x_3 + m_2 x_3$ $y_4 = \sim m_4 x_4 + m_4 x_3$ $y_5 = \sim m_4 x_5 + m_4 (x_2 x_5 + \sim x_2 x_4)$ $y_6 = \sim m_4 x_6 + m_4 (x_2 x_7 + x_2 x_6 \sim x_8)$ $y_7 = \sim m_4 x_7 + m_4 (x_2 x_9 + \sim x_2 x_6 x_8)$ $y_8 = \sim m_4 x_8 + m_4 \sim x_2 x_8$ $y_9 = \sim m_4 x_9 + m_4 \sim x_2 \sim x_8$ The present invention also includes short block decoders that convert data block vectors that have been encoded by a short block encoder back to the original data pattern. The short block decoder that corresponds to encoder 301 converts sets of 10-bit vectors back to 9-bit vectors by reversing the short block mappings described above. An embodiment of such a short block decoder uses five auxiliary variables $q_1$–$q_5$ and computes the inverse mapping via the Boolean expressions given below:

$q_1 = \sim (y_0 + y_1)$ $q_2 = y_0 \sim y_1$ $q_3 = \sim y_0 y_1$ $q_4 = y_0 y_1$ $q_5 = y_8 + y_9$ $x_1 = q_2 + q_3 + q_4$ $x_2 = q_1 y_2 + q_2 + q_4 \sim q_5$ $x_3 = (q_1+q_2)y_3 + q_3 y_2 + q_4 y_4$ $x_4 = \sim q_4 y_4 + q_4(\sim q_5 + y_5)$ $x_5 = \sim q_4 y_5 + q_4(q_5 + y_5)$ $x_6 = \sim q_4 y_6 + q_4(\sim q_5 + y_6 + y_7)$ $x_7 = \sim q_4 y_7 + q_4(q_5 + y_6)$ $x_8 = \sim q_4 y_7 + q_4(\sim q_5 + y_8)$ $x_9 = \sim q_4 y_9 + q_4(q_5 + y_7)$ The rate—9/10 short block encoder 301 has 47 two-input gates, and the corresponding short block decoder has 42 two-input gates. This gate count gives a total complexity for the encoder/decoder pair of 89 two-input gates.

Figure 4:
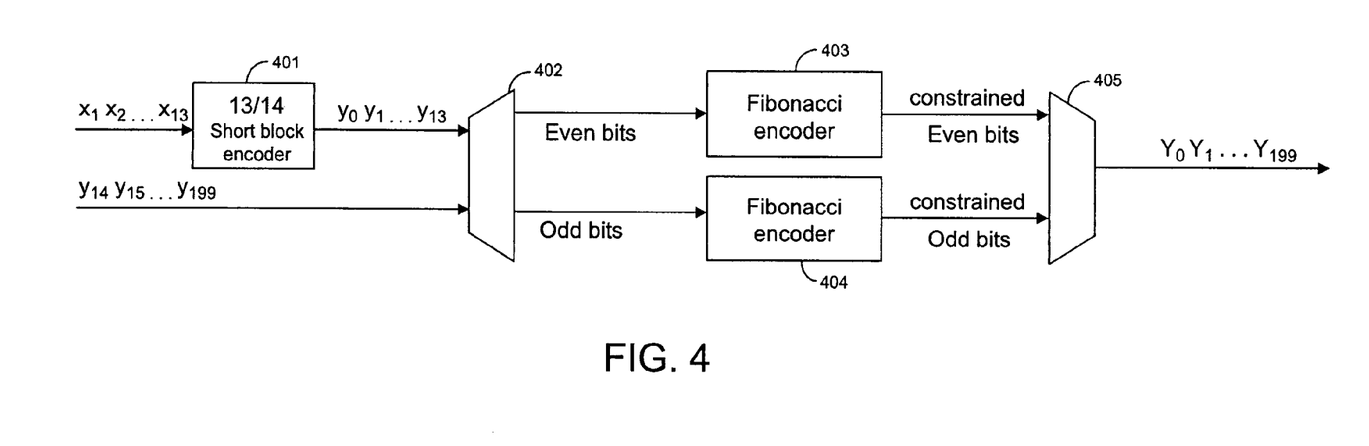
FIG. 4 illustrates an example of a modulation encoding scheme that uses a 13/14 short block encoder, according to an embodiment of the present invention.

An embodiment of a short block encoder having rate—13/14 constrained codes is shown in FIG. 4. The embodiment of FIG. 4 includes a short block encoder 401, a demultiplexer 402, Fibonacci encoders 403–404, and parallel-to-serial converter (or multiplexer) 405. Short block encoder 401 imposes constraints on the first 13 bits of each data block received. Short block encoder 401 maps a 13-bit vector in each data block to a 14-bit output vector to provide a 13/14-rate code.

Demultiplexer 402 separates the even and odd interleaves from the remaining 186-bit vector $(y_{13}, y_{14}, \ldots, y_{199})$ of the original data block and the 14-bit output vector of encoder 401. Fibonacci encoder 403 imposes a modulation constraint on the even interleave to generate a constrained even interleave. Fibonacci encoder 404 imposes a modulation constraint on the odd interleave to generate a constrained odd interleave. Parallel-to-serial converter 405 combines the constrained even and constrained odd interleaves into one serial data stream.

The constraints on the 14-bit output sequence $y_0, y_1, \ldots, y_3$ of the rate—9/10 short block encoder 401 are given by:

$(y_0, y_2) \neq (1,1)$ $(y_1, y_3) \neq (1,1)$ $(y_0, y_2, y_4, y_6, y_8) \neq (1,0,1,1,1)$ $(y_1, y_3, y_5, y_7, y_9) \neq (1,0,1,1,1)$ $(y_0, y_2, y_4, y_6, y_8, y_{10}, y_{12}) \neq (1,0,1,1,0,1,1)$ $(y_1, y_3, y_5, y_7, y_9, y_{11}, y_{13}) \neq (1,0,1,1,0,1,1)$ These constraints guarantee that the largest even/odd interleaved output sequence has a 7-bit prefix that does not exceed 1011010. The corresponding Boolean equations are given by:

$y_0 y_2 = 0$ $y_1 y_3 = 0$ $y_0 \sim y_2 y_4 y_6 y_8 = 0$ $y_1 \sim y_3 y_5 y_7 y_9 = 0$ $y_0 \sim y_2 y_4 y_6 \sim y_8 y_{10} y_{12} = 0$ $y_1 \sim y_3 y_5 y_7 \sim y_9 y_{11} y_{13} = 0$ An example of a Boolean logic implementation of the rate—13/14 encoder 401 maps input bit sequence $x_1, x_2, x_3, \ldots, x_{13}$ to output sequence $y_0, y_1, y_2, \ldots, y_{13}$ using the auxiliary variables $r_1$–$r_{12}$ as shown by the following logic functions:

$r_1 = x_4 x_6$ $r_2 = x_3 r_1$ $r_3 = x_8 r_1$ $r_4 = x_8 r_1$ $r_5 = x_5 x_7$ $r_6 = x_3 r_5$ $r_7 = x_9 r_5$ $r_8 = x_9 r_5$ $r_9 = x_1 \sim x_2$ $r_{10} = x_1 \sim x_2$ $r_{11} = x_{10} x_{12} r_4$ $r_{12} = x_{11} x_{13} r_8.$ The example Boolean logic implementation of the encoder also uses seven partitions $m_1, m_2, m_3, m_5, m_6, m_7, m_8$ where:

$m_1 = \sim x_1$ $m_2 = r_9 \sim r_3 \sim r_{11}$ $m_3 = r_{10} \sim r_7 \sim r_{12}$ $m_4 = \sim (m_1 + m_2 + m_3)$ $m_5 = r_9 r_3$ $m_6 = r_9 r_{11}$ $m_7 = r_{10} r_7$ $m_8 = r_{10} r_{12}$ The input/output map of the Boolean logic implementation of the 13/14 short block encoder 401 is specified by:

$y_0 = m_2 + m_4$ $y_1 = m_3 + m_4$ $y_2 = m_1 x_2 + m_3 x_3$ $y_3 = m_1 x_3 + m_2 x_3$ $y_4 = \sim m_4 x_4 + m_5 \sim r_5 x_3 + m_6 + m_7 \sim r_1 x_3 + m_8 \sim r_1 x_3$ $y_5 = \sim m_4 x_5 + m_5 \sim r_5 x_5 + m_6 \sim r_5 x_3 + m_7 \sim r_1 x_4 + m_8$ $y_6 = \sim m_4 x_6 + m_5 \sim r_5 \sim x_3 + m_6 + m_7 \sim r_1 \sim x_3 + m_8 \sim r_1 \sim x_3$ $y_7 = \sim m_4 x_7 + m_5(\sim r_5 x_7 + r_6) + m_6 \sim r_5 \sim x_3 + m_7(\sim r_1 x_6 + r_2) + m_8$ $y_8 = \sim m_4 x_8 + m_7 + m_8 x_8$ $y_9 = \sim m_4 x_9 + m_5 x_9 + m_6 x_9 + m_7 x_8$ $y_{10} = \sim m_4 x_{10} + m_5 x_{10} + m_6 \sim r_5 x_{10} + m_7 x_{10} + m_8 x_{10}$ $y_{11} = \sim m_4 x_{11} + m_5 x_{11} + m_6 x_{11} + m_7 x_{11} + m_8 \sim r_1 x_4$ $y_{12} = \sim m_4 x_{12} + m_5 x_{12} + m_6(\sim r_5 x_7 + r_6) + m_7 x_{12} + m_8 x_{12}$ $y_{13} = \sim m_4 x_{13} + m_5 x_{13} + m_6 x_{13} + m_7 x_{13} + m_8(\sim r_1 x_6 + r_2)$ A short block decoder that corresponds to encoder 401 converts 14-bit vectors back to 13-bit vectors by reversing the short block mappings described above. The Boolean logic implementation of the decoder for the rate—13/14 short block encoder uses the auxiliary variables $s_1$–$s_6$ given below:

$$s_1 = y_4 y_6$$

$$s_2 = y_8 s_1$$

$$s_3 = y_5 y_7$$

$$s_4 = y_9 s_3$$

$$s_5 = y_4 + y_6$$

$$s_6 = y_5 + y_7$$

The Boolean logic implementation of the decoder uses seven partitions $q_1, q_2, q_3, q_5, q_6, q_7, q_8$ where:

$$q_1 = \sim(y_0 + y_1)$$

$$q_3 = \sim y_0 \sim s_4 \sim (s_3 \sim y_9 y_{11} y_{13})$$

$$q_4 = y_0 y_1$$

$$q_5 = q_4 \sim s_1 \sim s_3 \sim y_8$$

$$q_6 = q_4 s_1 \sim s_3$$

$$q_7 = q_4 \sim s_1 \sim s_3 y_8$$

$$q_8 = q_4 \sim s_1 s_3$$

The input/output map for the decoder is specified by the following mappings:

$$x_1 = q_2 + q_3 + q_4$$

$$x_2 = q_1 y_2 + q_2 + (q_5 + q_6)$$

$$x_3 = (q_1 + q_2) y_3 + q_3 y_2 + q_5 (y_4 + \sim s_5 y_7) + q_6 (y_5 + \sim s_6 y_{12}) + q_7 (y_4 + \sim s_5 y_7) + q_8 (y_4 + \sim s_5 y_{13})$$

$$x_4 = \sim q_4 y_4 + q_5 + q_6 + q_7 (y_5 + \sim s_5) + q_8 (y_{11} + \sim s_5)$$

$$x_5 = \sim q_4 y_5 + q_5 (y_5 + \sim s_5) + q_6 (y_{10} + \sim s_6) + q_7 + q_8$$

$$x_6 = \sim q_4 y_6 + q_5 + q_6 + q_7 (s_5 y_7 + \sim s_5) + q_8 (s_5 y_{13} + \sim s_5)$$

$$x_7 = \sim q_4 y_7 + q_5 (s_5 y_7 + \sim s_5) + q_6 (s_6 y_{12} + \sim s_6) + q_7 + q_8$$

$$x_8 = \sim q_4 y_8 + q_5 + q_7 y_9 + q_8 y_8$$

$$x_9 = \sim q_4 y_9 + q_5 y_9 + q_6 y_9 + q_7$$

$$x_{10} = \sim q_4 y_{10} + q_5 y_{10} + q_6 + q_7 y_{10} + q_8 y_{10}$$

$$x_{11} = \sim q_4 y_{11} + q_5 y_{11} + q_6 y_{11} + q_7 y_{11} + q_8$$

$$x_{12} = \sim q_4 y_{12} + q_5 y_{12} + q_6 + q_7 y_{12} + q_8 y_{12}$$

$$x_{13} = \sim q_4 y_{13} + q_5 y_{13} + q_6 y_{13} + q_7 y_{13} + q_8$$

The rate—13/14 encoder 401 has 93 two-input gates, and the corresponding decoder has 102 two-input gates. This gate count gives a total complexity for the encoder/decoder pair of 195 two-input gates.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A disk drive system comprising:
    a short block encoder that applies constraints to a first subset of bits in a data block to generate output bits;
    a demultiplexer that separates even and odd bits from a second subset of bits in the data block and the output bits of the short block encoder;
    a first modulation encoder that encodes the even bits to generate constrained even bits; and
    a second modulation encoder that encodes the odd bits to generate constrained odd bits.

2. The disk drive system defined in claim 1 further comprising:
    a multiplexer that interleaves the constrained even bits and the constrained odd bits into one data stream.

3. The disk drive system defined in claim 1 wherein the first modulation encoder and the second modulation encoder are Fibonacci encoders.

4. The disk drive system defined in claim 3 wherein the first modulation encoder maps N even bits to N constrained even bits, and the second modulation encoder maps N odd bits to N constrained odd bits.

5. The disk drive system defined in claim 1 wherein the short block encoder maps P bits to P+1 output bits.

6. The disk drive system defined in claim 5 wherein the short block encoder maps a 3-bit vector of the data block to a 4-bit output vector.

7. The disk drive system defined in claim 5 wherein the short block encoder maps a 9-bit vector of the data block to a 10-bit output vector.

8. The disk drive system defined in claim 5 wherein the short block encoder maps a 13-bit vector of the data block to a 14-bit output vector.

9. The disk drive system defined in claim 2 wherein the first modulation encoder applies an even global constraint to the constrained even bits, the second modulation encoder applies an odd global constraint to the constrained odd bits, and the multiplexer generates interleaved data that has a global constraint equal to twice the minimum of the even global constraint or the odd global constraint.

10. The disk drive system defined in claim 9 wherein the interleaved data has an interleaved constraint equal to the greater of the even global constraint or the odd global constraint.

11. A disk drive controller chipset comprising:
    a short block encoder that maps a first portion of each block of input data to an output sequence;
    means for separating even and odd interleaves from a second portion of each block of input data and from the output sequence of the short block encoder;
    means for applying a first modulation constraint to the even interleaves to generate constrained even interleaves; and
    means for applying a second modulation constraint to the odd interleaves to generate constrained odd interleaves.

12. The disk drive controller chipset defined in claim 11 wherein the short block encoder maps P-bit vectors within each block of input data to P+1 bit output vectors.

13. The disk drive controller chipset defined in claim 11 wherein the short block encoder maps 3-bit vectors within each block of input data to 4-bit output vectors.

14. The disk drive controller chipset defined in claim 11 wherein the short block encoder maps 9-bit vectors within each block of input data to 10-bit output vectors.

15. The disk drive controller chipset defined in claim 11 wherein the short block encoder maps 13-bit vectors within each block of input data to 14-bit output vectors.

16. The disk drive controller chipset defined in claim 11 wherein the means for applying the first modulation constraint comprises means for mapping N even bits to N constrained even bits, and the means for applying the second modulation constraint comprises means for mapping N odd bits to N constrained odd bits.

17. The disk drive controller chipset defined in claim 11 further comprising:
   a parallel-to-serial converter that interleaves the constrained even interleaves and the constrained odd interleaves into one data stream.

18. A method for performing modulation encoding on blocks of data prior to recording the data on a computer readable medium, the method comprising:
   applying a modulation constraint to a first portion of each data block to generate a constrained output;
   separating even and odd interleaves of the constrained output and a second portion of each data block;
   imposing modulation constraints on the even interleaves to generate constrained even interleaves;
   imposing modulation constraints on the odd interleaves to generate constrained odd interleaves; and
   interleaving the constrained even interleaves and the constrained odd interleaves.

19. The method defined in claim 18 wherein applying the modulation constraint to the first portion of each data block further comprises mapping 3 bits in each data block to 4 bits in the constrained output using a short block encoder.

20. The method defined in claim 18 wherein applying the modulation constraint to the first portion of each data block further comprises mapping 9 bits in each data block to 10 bits in the constrained output using a short block encoder.

21. The method defined in claim 18 wherein applying the modulation constraint to the first portion of each data block further comprises mapping 13 bits in each data block to 14 bits in the constrained output using a short block encoder.

22. The method defined in claim 18 wherein imposing modulation constraints on the even interleaves comprises mapping N even bits to N constrained even bits, and imposing modulation constraints on the odd interleaves comprises mapping N odd bits to N constrained odd bits.

* * * * *

UNITED STATES PATENT AND TRADEMARK OFFICE
CERTIFICATE OF CORRECTION

PATENT NO. : 7,064,687 B1
APPLICATION NO. : 11/048273
DATED : June 20, 2006
INVENTOR(S) : Blaum et al.

It is certified that error appears in the above-identified patent and that said Letters Patent is hereby corrected as shown below:

Column 5, line 64, insert -- $(y_1, y_3) \neq (1,1)$ --.

Column 6, line 40, should read "$y_6 = \sim m_4 \, x_6 + m_4 \, (x_2 \, x_7 + \sim x_2 \, x_6 \sim x_8)$".

Column 7, line 45, should read "$(y_0, y_2, y_4, y_6, y_8, y_{10}, y_{12}) \neq (1,0,1,1,0,1,1)$".

Column 7, line 58, should read "$y_1 \sim y_3 \, y_5 \, y_7 \, y_9 = 0$".

Column 9, line 21, insert -- $q_2 = y_0 \sim y_1 \sim s_2 \sim (s_1 \sim y_8 \, y_{10} \, y_{12})$ --.

Column 9, line 22, should read "$q_3 = \sim y_0 \, y_1 \sim s_4 \sim (s_3 \sim y_9 \, y_{11} \, y_{13})$".

Signed and Sealed this

Thirtieth Day of January, 2007

JON W. DUDAS
*Director of the United States Patent and Trademark Office*